(12) United States Patent
Lee et al.

(10) Patent No.: US 12,360,166 B2
(45) Date of Patent: Jul. 15, 2025

(54) BATTERY DIAGNOSIS APPARATUS, BATTERY PACK, ELECTRIC VEHICLE AND BATTERY DIAGNOSIS METHOD

(71) Applicant: LG Energy Solution, Ltd., Seoul (KR)

(72) Inventors: Sun-Jong Lee, Daejeon (KR); Cheol-Taek Kim, Daejeon (KR); Yong-Chul Sung, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 0 days.

(21) Appl. No.: 18/030,381

(22) PCT Filed: Jul. 12, 2022

(86) PCT No.: PCT/KR2022/010158
§ 371 (c)(1),
(2) Date: Apr. 5, 2023

(87) PCT Pub. No.: WO2023/287180
PCT Pub. Date: Jan. 19, 2023

(65) Prior Publication Data
US 2023/0366935 A1    Nov. 16, 2023

(30) Foreign Application Priority Data
Jul. 12, 2021    (KR) .......... 10-2021-0091231

(51) Int. Cl.
*G01R 31/36* (2020.01)
*G01R 31/00* (2006.01)
*G01R 31/3835* (2019.01)

(52) U.S. Cl.
CPC ....... *G01R 31/3648* (2013.01); *G01R 31/007* (2013.01); *G01R 31/3835* (2019.01)

(58) Field of Classification Search
CPC .................................................. G01R 31/392
See application file for complete search history.

(56) References Cited

U.S. PATENT DOCUMENTS

| 11,768,251 B2 * | 9/2023 | Sung | G01R 31/3648 |
|---|---|---|---|
| | | | 701/33.6 |
| 2014/0236509 A1 | 8/2014 | Kim | |

(Continued)

FOREIGN PATENT DOCUMENTS

| EP | 4152021 A1 | 3/2023 |
|---|---|---|
| JP | 2001027663 A | 1/2001 |

(Continued)

OTHER PUBLICATIONS

Extended European Search Report including Written Opinion for Application No. 22842442.0 dated Mar. 1, 2024, pp. 1-8.

(Continued)

*Primary Examiner* — Noam Reisner
(74) *Attorney, Agent, or Firm* — Lerner David LLP (57) ABSTRACT

A battery diagnosis apparatus according to the present disclosure is directed to providing a battery diagnosis apparatus, a battery pack, an electric vehicle and a battery diagnosis method for diagnosing anomalies in a single battery cell or each of a plurality of battery cells connected in series using time-dependent changes in cell voltage of each battery cell without a process of comparing the cell voltage of each battery cell with the cell voltage of other battery cell(s).

13 Claims, 8 Drawing Sheets

(56) References Cited

U.S. PATENT DOCUMENTS

| | | |
|---|---|---|
| 2015/0115971 A1 | 4/2015 | Kim et al. |
| 2016/0018472 A1 | 1/2016 | Sung et al. |
| 2019/0324092 A1 | 10/2019 | Sabina |
| 2020/0025832 A1* | 1/2020 | Cho ..................... G01R 31/392 |
| 2020/0233037 A1 | 7/2020 | Yamamoto et al. |
| 2021/0055352 A1 | 2/2021 | Takahashi et al. |
| 2022/0196752 A1 | 6/2022 | Lee et al. |
| 2022/0229122 A1 | 7/2022 | Lee et al. |

FOREIGN PATENT DOCUMENTS

| | | |
|---|---|---|
| JP | 2008302899 A | 12/2008 |
| JP | 4860444 B2 | 1/2012 |
| JP | 2017156268 A | 9/2017 |
| JP | 2019523399 A | 8/2019 |
| JP | 2020119712 A | 8/2020 |
| JP | WO2019175707 A1 | 3/2021 |
| KR | 20100084935 A | 7/2010 |
| KR | 20140104893 A | 8/2014 |
| KR | 20160010132 A | 1/2016 |
| KR | 101818515 B1 | 1/2018 |
| KR | 102105170 B1 | 4/2020 |
| KR | 20210031336 A | 3/2021 |
| KR | 20210054331 A | 5/2021 |

OTHER PUBLICATIONS

International Search Report for PCT/KR2022/010158 mailed Oct. 20, 2022. 3 pgs.

* cited by examiner

BATTERY DIAGNOSIS APPARATUS, BATTERY PACK, ELECTRIC VEHICLE AND BATTERY DIAGNOSIS METHOD

CROSS REFERENCE TO RELATED APPLICATIONS

The present application is a national phase entry under 35 U.S.C. § 371 of International Application No. PCT/KR2022/010158 filed Jul. 12, 2022 which claims priority to Korean Patent Application No. 10-2021-0091231 filed on Jul. 12, 2021 in the Republic of Korea, the disclosures of which are incorporated herein by reference.

TECHNICAL FIELD

The present disclosure relates to battery cell anomaly diagnosis.

BACKGROUND ART

Recently, there has been a rapid increase in the demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have hale or no memory effect, and thus they, are gaining more attention than nickel-based batteries for their advantages that recharging can be done whenever it is convenient, the self-discharge rate is very low and the energy density is high.

More recently, with the widespread use of applications (for example, electric vehicles, energy storage systems) requiring high voltage, there is a growing need for diagnosis technology for accurate anomaly detection for each of a plurality of battery cells connected in series in a battery pack.

Prior art usually employs a method of detecting anomalies in each battery cell by comparing the state parameters (for example, a cell voltage) of each battery cell with the state parameters of at least one of the remaining battery cells. However, the corresponding method has disadvantages: (i) since it needs the number of comparison processes corresponding to the number of battery cells, it requires a lot of software resources (computational complexity) and time to individually diagnose anomalies in all the battery cells and (ii) diagnostic errors are more likely to occur with the increasing number of abnormal battery cells.

SUMMARY Technical Problem

The present disclosure is designed to solve the above-described problem, and therefore the present disclosure is directed to providing a battery diagnosis apparatus, a battery pack, an electric vehicle and a battery diagnosis method for diagnosing anomalies in a single battery cell or each of a plurality of battery cells connected in series using time-dependent changes in cell voltage of each battery cell without a process of comparing the cell voltage of each battery cell with the cell voltage of other battery cell(s).

These and other objectives and advantages of the present disclosure may be understood by the following description and will be apparent from an embodiment of the present disclosure. In addition, it will be readily understood that the objectives and advantages of the present disclosure may be realized by the means set forth in the appended claims and a combination thereof.

Technical Solution

A battery diagnosis apparatus according to an aspect of the present disclosure includes a voltage detector configured to measure a cell voltage of a battery cell; and a control circuit configured to determine a plurality of sub-voltage curves by applying a moving window of a first time length to a reference voltage curve, the reference voltage curve being a time series of voltage values indicating the cell voltage measured at each sampling time for a predetermined period of time. The control circuit is configured to, for each sub-voltage curve, determine a long-term average voltage value of the sub-voltage curve using a first average filter of the first time length, determine a short-term average voltage value of the sub-voltage curve using a second average filter of a second time length that is shorter than the first time length, and determine a voltage deviation associated with the sub-voltage curve by calculating a difference between the long-term average voltage value and the short-term average voltage value of the sub-voltage curve. The control circuit is configured to determine whether the battery cell is abnormal by comparing each of a plurality of the voltage deviations determined for the plurality of sub-voltage curves with at least one of a first deviation threshold or a second deviation threshold.

The first deviation threshold may be a positive number, and the second deviation threshold may be a negative number of which an absolute value is equal to the first deviation threshold.

The control circuit may be configured to determine that the battery cell is abnormal when the voltage deviations of a predetermined number or more of sub-voltage curves among the plurality of sub-voltage curves are larger than the first deviation threshold or smaller than the second deviation threshold.

The control circuit may be configured to determine that the battery cell is abnormal when any two of the plurality of voltage deviations determined for the plurality of sub-voltage curves meet a first requirement, a second requirement and a third requirement. The first requirement is that one of the two voltage deviations is equal to or larger than the first deviation threshold. The second requirement is that the other of the two voltage deviations is equal to or smaller than the second deviation threshold. The third requirement is that a time interval between the two voltage deviations is equal to or smaller than a threshold time.

The battery diagnosis apparatus may further include a current detector configured to measure a battery current flowing through the battery cell.

The control circuit may be configured to determine a plurality of sub-current curves by applying the moving window to a reference current curve, the reference current curve being a time series of current values indicating the battery current measured at each sampling time for the predetermined period of time. The plurality of sub-current curves have a one-to-one correspondence with the plurality of sub-voltage curves.

The control circuit may be configured to, for each sub-current curve, determine a current change which is a difference between a maximum current value and a minimum current value of the sub-current curve, and determine the long-term average voltage value and the short-term average voltage value of the sub-voltage curve associated with the sub-current curve when the current change is smaller than a threshold change.

A battery pack according to another aspect of the present disclosure includes the battery diagnosis apparatus.

An electric vehicle according to still another aspect of the present disclosure includes the battery pack.

A battery diagnosis method according to yet another aspect of the present disclosure includes determining, by a control circuit, a plurality of sub-voltage curves by applying a moving window of a first time length to a reference voltage curve, the reference voltage curve being a time series of voltage values indicating a cell voltage of a battery cell measured, by a voltage detector, at each sampling time for a predetermined period of time; determining, by the control circuit for each sub-voltage curve, a long-term average voltage value of the sub-voltage curve using a first average filter of the first time length, determining, by the control circuit for each sub-voltage curve, a short-term average voltage value of the sub-voltage curve using a second average filter of a second time length that is shorter than the first time length, and determining, by the control circuit for each sub-voltage curve, a voltage deviation associated with the sub-voltage curve by calculating a difference between the long-term average voltage value and the short-term average voltage value of the sub-voltage curve; and determining, by the control circuit, whether the battery cell is abnormal by comparing each of a plurality of the voltage deviations determined for the plurality of sub-voltage curves with at least one of a first deviation threshold or a second deviation threshold.

The first deviation threshold may be a positive number, and wherein the second deviation threshold may be a negative number of which an absolute value is equal to the first deviation threshold.

The method includes determining whether the battery cell is abnormal when the voltage deviation of a predetermined number or more of sub-voltage curves among the plurality of sub-voltage curves is larger than the first deviation threshold or smaller than the second deviation threshold.

The method further includes determining whether the battery cell is abnormal when any two of a plurality of the voltage deviations determined for the plurality of sub-voltage curves meet a first requirement, a second requirement and a third requirement. The first requirement may be that one of the two voltage deviations is equal to or larger than the first deviation threshold. The second requirement may be that the other of the two voltage deviations is equal to or smaller than the second deviation threshold. The third requirement may be that a time interval between the two voltage deviations is equal to or smaller than a threshold time.

The method may further include determining a plurality of sub-current curves by applying the moving window to a reference current curve, the reference current curve being a time series of current values indicating a battery current measured at each sampling time for the predetermined period of time. The plurality of sub-current curves have a one-to-one correspondence with the plurality of sub-voltage curves.

The method may further include, for each sub-current curve, determining a current change which is a difference between a maximum current value and a minimum current value of the sub-current curve, and determining the long-term average voltage value and the short-term average voltage value of the sub-voltage curve associated with the sub-current curve on a condition that the current change is smaller than a threshold change.

Advantageous Effects

According to at least one of the embodiments of the present disclosure, it is possible to diagnose anomalies in a single battery cell or each of a plurality of battery cells connected in series using time-dependent changes in cell voltage of each battery cell without a process of comparing the cell voltage of each battery cell with the cell voltage of the other battery cell(s). Accordingly, it is possible to save the software resources and time required to diagnose anomalies in each battery cell, and reduce the risk that diagnosis errors increase with the increasing number of abnormal battery cells.

According to at least one of the embodiments of the present disclosure, it is possible to effectively remove measurement noise included in measured cell voltage values of a corresponding battery cell by calculating a difference between a long-term trend and a short-term trend of cell voltages of each battery cell, thereby precisely detecting abnormal changes in cell voltage of the corresponding battery cell.

The effects of the present disclosure are not limited to the above-mentioned effects, and these and other effects will be clearly understood by those skilled in the art from the appended claims.

BRIEF DESCRIPTION OF THE DRAWINGS

The accompanying drawings illustrate an exemplary embodiment of the present disclosure, and together with the following detailed description of the present disclosure, serve to provide a further understanding of the technical aspects of the present disclosure, and thus the present disclosure should not be construed as being limited to the drawings.

DETAILED DESCRIPTION

Hereinafter, an exemplary embodiment of the present disclosure will be described in detail with reference to the accompanying drawings. Prior to the description, it should be understood that the terms or words used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein and the illustration shown in the drawings is an exemplary embodiment of the present disclosure, but not intended to fully describe the technical aspects of the present disclosure, so it should be understood that a variety of other equivalents and modifications could have been made thereto at the time that the application was filed.

The terms including the ordinal number such as "first", "second" and the like, are used to distinguish one element from another among various elements, but not intended to limit the elements.

Unless the context clearly indicates otherwise, it will be understood that the term "comprises" when used in this specification, specifies the presence of stated elements, but does not preclude the presence or addition of one or more other elements. Additionally, the term "control circuit" as used herein refers to a processing unit of at least one function or operation, and may be implemented in hardware and software either alone or in combination.

In addition, throughout the specification, it will be further understood that when an element is referred to as being "connected to" another element, it can be directly connected to the other element or intervening elements may be present.

Figure 1:
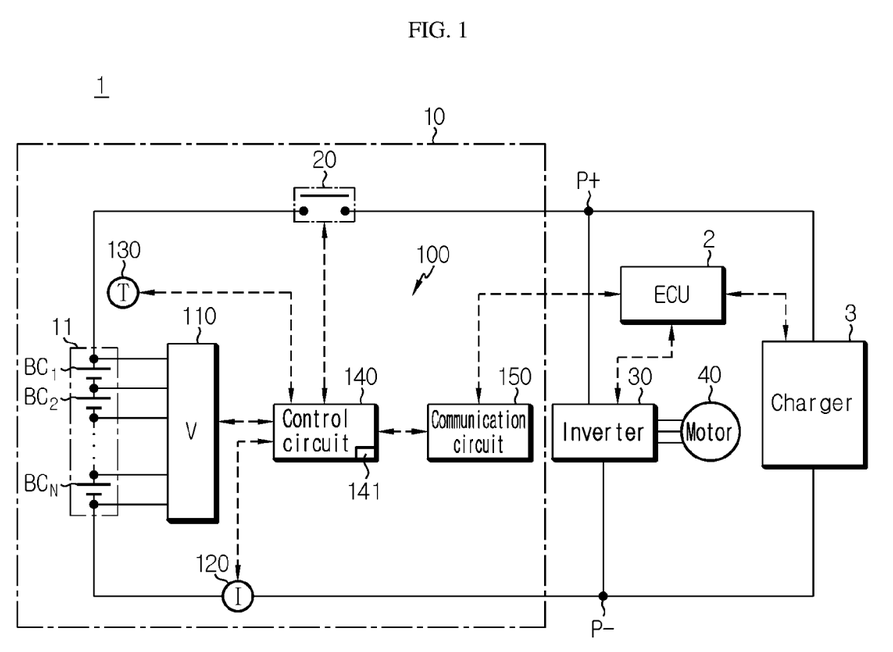
FIG. 1 is a diagram exemplarily showing the components of an electric vehicle according to the present disclosure.

FIG. 1 is a diagram exemplarily showing the components of an electric vehicle according to the present disclosure.

Referring to FIG. 1, the electric vehicle 1 includes a vehicle controller 2, a battery pack 10, an inverter 30 and an electric motor 40. Charge/discharge terminals P+, P− of the battery pack 10 may be electrically coupled to a charger 3 through a charging cable. The charger 3 may be included in the electric vehicle 1, or may be disposed in a charging station.

The vehicle controller 2 (for example, an Electronic Control Unit (ECU)) is configured to transmit a key-on signal to a battery diagnosis apparatus 100 in response to an ignition button (not shown) of the electric vehicle 1 being changed to ON-position by a user. The vehicle controller 2 is configured to transmit a key-off signal to the battery diagnosis apparatus 100 in response to the ignition button being changed to OFF-position by the user. The charger 3 may supply a charge power of constant current or constant voltage through the charge/discharge terminals P+, P− of the battery pack 10 by the communication with the vehicle controller 2. The charger 3 may have a discharging function, and prior to a first charging stage 51 as described below, may discharge a battery 11 so that a battery voltage (for example, an open-circuit voltage (OCV)) of the battery 11 is equal to or less than a predetermined reference voltage in response to a request from the vehicle controller 2.

The battery pack 10 includes the battery 11, a relay 20 and the battery diagnosis apparatus 100.

The battery 11 includes at least one battery cell BC. FIG. 1 shows the battery 11 including a plurality of battery cells $BC_1 \sim BC_N$ (N is a natural number of 2 or greater) connected in series by way of illustration. The plurality of battery cells $BC_1 \sim BC_N$) may be provided with the same electrical and chemical specification. Hereinafter, in the common description to the plurality of battery cells $BC_1 \sim BC_N$, the reference character 'BC' is given to the battery cell.

The battery cell BC is not limited to a particular type, and may include any type of battery cell that can be recharged repeatedly, for example, a lithium ion cell.

The relay 20 is electrically connected in series to the battery 11 through a power path connecting the battery 11 to the inverter 30. FIG. 1 shows the relay 20 connected between a positive terminal of the battery 11 and the charge/discharge terminal P+. The relay 20 is controlled into on/off in response to a switching signal from the battery diagnosis apparatus 100. The relay 20 may be a mechanical contactor that is turned on and off by the electromagnetic force of the coil or a semiconductor switch such as a Metal Oxide Semiconductor Field Effect transistor (MOSFET).

The inverter 30 is provided to convert the direct current from the battery 11 included in the battery pack 10 to an alternating current in response to a command from the battery diagnosis apparatus 100 or the vehicle controller 2. The electric motor 40 operates using the alternating current power from the inverter 30. The electric motor 40 may include, for example, a 3-phase alternating current motor. The inverter 30, the electric motor 40 and the components in the electric vehicle 1 that are supplied with the discharge power of the battery 11 may be collectively referred to as an electrical load.

The battery diagnosis apparatus 100 includes a voltage detector 110 and a control circuit 140. The battery diagnosis apparatus 100 may further include at least one of a current detector 120, a temperature detector 130 or a communication circuit 150.

The voltage detector 110 is connected to the positive and negative terminals of the battery cell BC, and is configured to measure a cell voltage across the battery cell BC and generate a voltage signal indicating the measured cell voltage. The voltage detector 110 may include at least one of known voltage detection devices such as a voltage measurement integrated circuit (IC).

The current detector 120 is connected in series to the battery 11 through the current path between the battery 11 and the inverter 30. The current detector 120 is configured to measure a battery current (also referred to as a 'charge/discharge current') flowing through the battery 11 and generate a current signal indicating the measured battery current. Since the plurality of battery cells $BC_1 \sim BC_N$ is connected in series, the battery current flowing through any one of the plurality of battery cells $BC_1 \sim BC_N$ is equal to the battery current flowing through the remaining battery cells. The current detector 120 may include at least one of known current detection devices such as a shunt resistor and a hall effect device.

The temperature detector 130 is configured to measure a battery temperature of the battery 11 and generate a temperature signal indicating the measured battery temperature. The temperature detector 130 may include at least one of known temperature detection devices such as a thermocouple, a thermistor and a bimetal.

The communication circuit 150 is configured to support wired or wireless communication between the control circuit 140 and the vehicle controller 2. The wired communication may be, for example, controller area network (CAN) communication, and the wireless communication may be, for example, Zigbee or Bluetooth communication. The communication protocol is not limited to a particular type and may include any type of communication protocol that supports wired/wireless communication between the control circuit 140 and the vehicle controller 2. The communication circuit 150 may include an output device (for example, a display, a speaker) to provide information received from the control circuit 140 and/or the vehicle controller 2 in a recognizable format for the user (a driver).

The control circuit 140 is operably coupled to the relay 20, the voltage detector 110 and the communication circuit 150. Operably coupled refers to connected directly/indirectly to transmit and receive a signal in one or two directions.

The control circuit 140 may collect the voltage signal from the voltage detector 110, the current signal from the current detector 120 and/or the temperature signal from the temperature detector 130. That is, the control circuit 140 may convert each analog signal collected from the sensors 110, 120, 130 to a digital value using an Analog to Digital Converter (ADC) within the control circuit 140 and record it. Alternatively, each of the voltage detector 110, the current detector 120 and the temperature detector 130 may include its ADC to transmit the digital value to the control circuit 140.

The control circuit 140 may be also referred to as a 'battery controller' and may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors or electrical units for performing the other functions.

The memory 141 may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) or programmable read-only memory (PROM). The memory 141 may store data and programs required for the computation by the control circuit 140. The memory 141 may store data indicating the computation results by the control circuit 140. The memory 141 may store datasets and software used to determine whether the battery cell BC is abnormal. The memory 141 may be integrated into the control circuit 140.

When the relay 20 is turned on during the operation of the electrical load 30, 40 and/or the charger 3, the battery 11 goes into a charge mode or a discharge mode. When the relay 20 is turned off while the battery 11 is used in the charge mode or the discharge mode, the battery 11 is switched to a rest mode.

The control circuit 140 may turn on the relay 20 in response to the key-on signal. The control circuit 140 may turn off the relay 20 in response to the key-off signal. The key-on signal is a signal requesting the switch from rest to charge or discharge. The key-off signal is a signal requesting the switch from charge or discharge to rest. Alternatively, instead of the control circuit 140, the vehicle controller 2 may take responsibility for the ON/OFF control of the relay 20.

Although FIG. 1 shows the battery diagnosis apparatus 100 included in the battery pack 10 for the electric vehicle 1, it should be understood that this is provided for illustrative purposes. That is, the battery diagnosis apparatus 100 may be included in a test system for an abnormal screening test in the process of manufacturing the battery cell BC.

Figure 2:
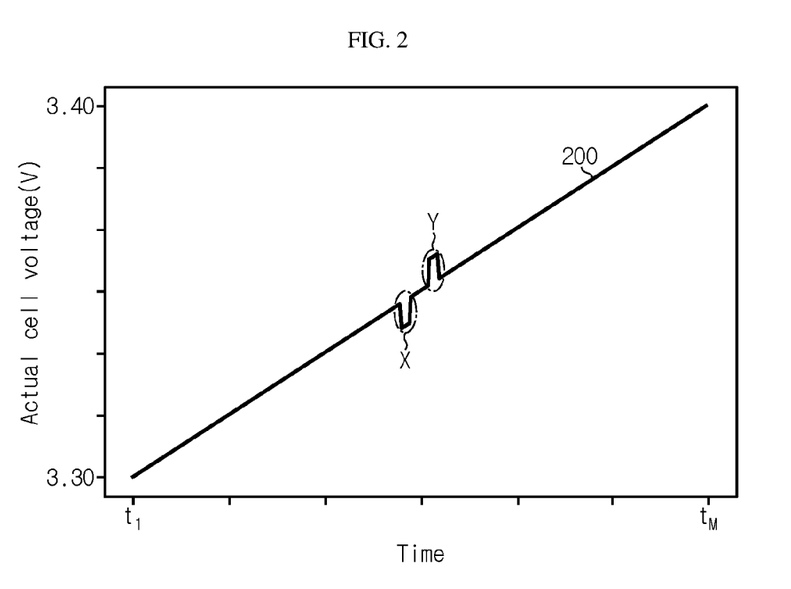
FIG. 2 is a graph exemplarily showing a voltage curve corresponding to a raw time series of actual voltage values of cell voltage of a battery cell.
Figure 3:
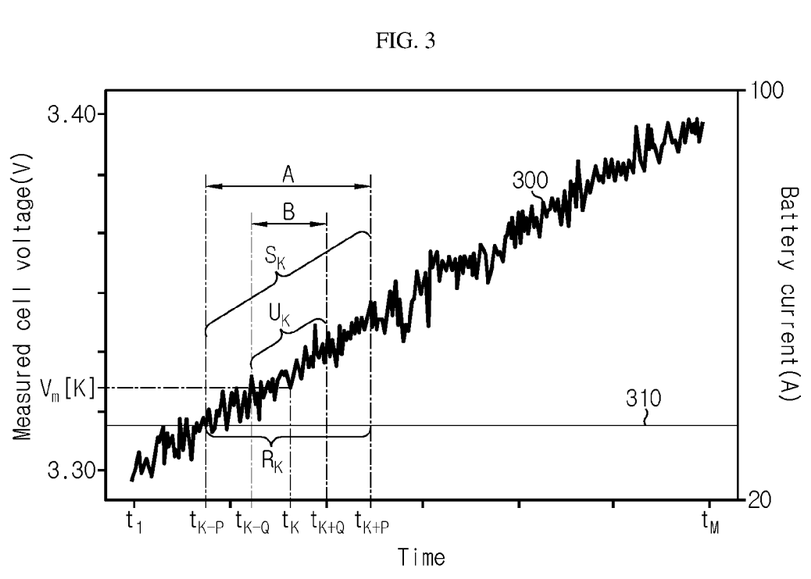
FIG. 3 is a graph exemplarily showing a measured voltage curve obtained by mixing in measurement noise with the raw time series corresponding to the voltage curve of FIG. 2.
Figure 4:
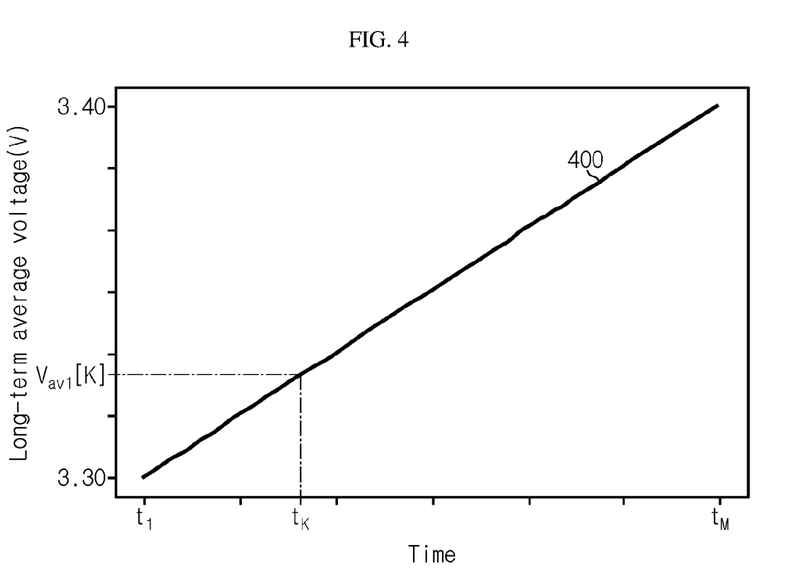
FIG. 4 is a graph exemplarily showing a first moving average curve obtained by applying a first average filter to the voltage curve of FIG. 3.
Figure 5:
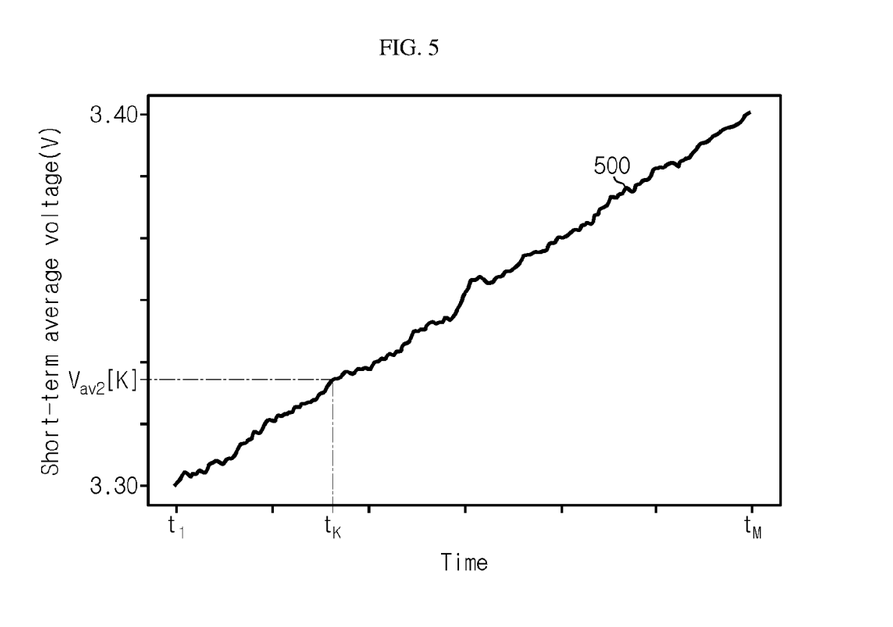
FIG. 5 is a graph exemplarily showing a second moving average curve obtained by applying a second average filter to the voltage curve of FIG. 3.
Figure 6:
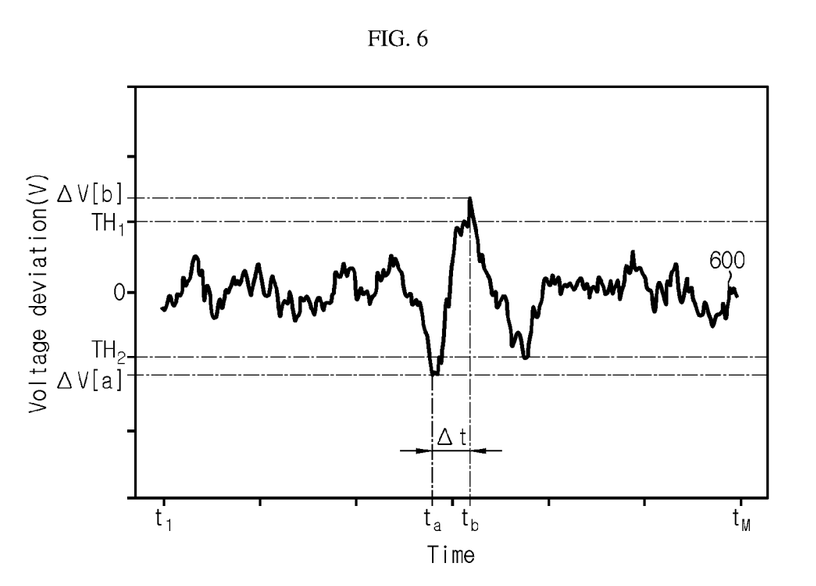
FIG. 6 is a graph exemplarily showing a voltage deviation curve which is a difference between the first moving average curve of FIG. 4 and the second moving average curve of FIG. 5.

FIG. 2 is a graph exemplarily showing a voltage curve corresponding to a raw time series of actual voltage values of cell voltage of the battery cell, FIG. 3 is a graph exemplarily showing a measured voltage curve obtained by mixing in measurement noise with the raw time series corresponding to the voltage curve of FIG. 2, FIG. 4 is a graph exemplarily showing a first moving average curve obtained by applying a first average filter to the voltage curve of FIG. 3, FIG. 5 is a graph exemplarily showing a second moving average curve obtained by applying a second average filter to the voltage curve of FIG. 3, and FIG. 6 is a graph exemplarily showing a voltage deviation curve which is a difference between the first moving average curve of FIG. 4 and the second moving average curve of FIG. 5.

To begin with, referring to FIG. 2, the voltage curve 200 is an example of a raw time series including the actual voltage values of the cell voltage of the battery cell BC during charging over a predetermined period of time $t_1 \sim t_M$. To help understanding, the cell voltage increases linearly, and the illustration of the actual voltage values for the period of time before values $t_1$ and the period of time after $t_M$ is omitted.

When the battery cell BC is normal, the cell voltage keeps increasing gently during charging. In contrast, when the battery cell BC is abnormal due to the internal faulty condition (for example, a micro short circuit, a torn part of the electrode tab), abnormal behaviors such as a temporary sharp drop or rise in the cell voltage may be irregularly observed during charging. The voltage curve 200 of FIG. 2 is associated with anomalies in the battery cell BC, and an area X indicates a range of time in which the cell voltage abnormally drops sharply, and an area Y indicates a range of time in which the cell voltage abnormally rises sharply. Although FIG. 2 shows the cell voltage during charging, the abnormal battery cell may abnormally change in cell voltage during discharging or resting. For example, during discharging, the cell voltage of the normal battery cell may keep decreasing gently, while the cell voltage of the abnormal battery cell may temporarily rise or drop sharply.

Subsequently, referring to FIG. 3, the voltage curve 300 indicates a result of mixing in the measurement noise with the actual cell voltages of the voltage curve 200 of FIG. 2, i.e., a time series of voltage values indicating the measured cell voltage arranged in chronological order. When M is a natural number indicating a predetermined total sample size (for example, 300) and K is a natural number of M or smaller, tK is a measurement timing (a K-th measurement timing $t_K$) of the K-th voltage value $V_m[K]$ in chronological order among the total of M voltage values included in the voltage curve 300, and two adjacent measurement timings are at a time interval corresponding to a predetermined sampling time (for example, 0.1 sec). The voltage value $V_m[K]$ is a data point indexed to the measurement timing tK among the total of M voltage values included in the voltage curve 300.

The measurement noise may irregularly occur due to the internal/external factors (for example, temperature, sampling rate and electromagnetic waves of the voltage measurement device, etc.) of the voltage detector 110. The current curve 310 is a time series including the current values of the battery current measured over the predetermined period of time $t_1 \sim t_M$. For convenience of description, the drawing shows that the battery current is constant for the predetermined period of time $t_1 \sim t_M$.

When the voltage curve 300 of FIG. 3 is compared with the voltage curve 200 of FIG. 2, it is easy to identify the abnormal behaviors X, Y from the voltage curve 200 free of the measurement noise of FIG. 2, while it is difficult to identify the abnormal behaviors X, Y from the voltage curve 300 of FIG. 3 having the measurement noise over the entire predetermined period of time $t_1 \sim t_M$.

The inventors found that the above-described problem was solved by applying a first average filter and a second average filter to the time series 300 of the voltage values (the measured values) including the measurement noise occurring at the measurement timing of the cell voltage. The time series of the voltage values of the target battery cell BC obtained over the past predetermined period of time may be referred to as a 'reference voltage curve', and the time series of the current values may be referred to as a 'reference current curve'. The following description is made under the assumption that the voltage curve 300 and the current curve 310 are the reference voltage curve and the reference current curve, respectively.

First, the control circuit 140 may determine a plurality of sub-voltage curves by applying a moving window of a first time length to the reference voltage curve 300. Furthermore, the control circuit 140 may determine a plurality of sub-current curves having a one-to-one correspondence with the plurality of sub-voltage curves by applying the moving window of the first time length to the reference current curve 310.

When K is a natural number of M or smaller, a total of M sub-voltage curves (i.e., first to M sub-voltage curves) may be determined from the reference voltage curve 300. The reference voltage curve 300 includes the total of M voltage values (i.e., first to M voltage values) measured in a sequential order at each sampling time W. The sub-voltage curve $S_K$ includes (A/W+1) voltage values that are consecutive in chronological order as subsets of the reference voltage curve 300. In an example, where the sampling time W=0.1 sec and the first time length A=10 sec, the sub-voltage curve $S_K$ is a time series of a total of 101 voltage values from the (K-P)-th voltage value to the (K+P)-th voltage value. P=A/2W=50.

In FIG. 3, RK is the sub-current curve associated with the sub-voltage curve $S_K$. Accordingly, the sub-current curve $R_K$ may also include (A/W+1) data points (current values) that are consecutive in chronological order.

As the battery current changes greatly, the cell voltage also changes greatly. The sharp change in cell voltage by the battery current is a factor that hinders identification of the abnormal behaviors of the cell voltage from the reference voltage curve 300. Accordingly, the control circuit 140 may perform the following computation process for the sub-voltage curve $S_K$ on the condition that a current change of the sub-current curve $R_K$) is equal to or smaller than a threshold change. The current change of the sub-current curve $R_K$ may be a difference between the maximum current value and the minimum current value of the sub-current curve $R_K$. The present disclosure is suitable for the diagnosis of anomalies in the battery cell from the time series of the cell voltages measured during constant current charging or resting, for example, during which there are small changes in the battery current.

Referring to FIG. 4, the first average voltage curve 400 is obtained by applying the first average filter of the first time length A to the reference voltage curve 300. The first average filter may be a low pass filter, for example, a centered moving average having the subset size (A/W+1) corresponding to the first time length A. In an example, the control circuit 140 determines a long-term average voltage value $V_{av1}[K]$ indexed to the measurement timing tK by calculating an average of the (A/W+1) voltage values included in the sub-voltage curve $S_K$, i.e., from the (K-P)-th voltage value to the (K-1)-th voltage value, the K-th voltage value and the (K+1)-th voltage value to the (K+P)-th voltage value. The following Equation 1 represents the first average filter.

$$V_{av1}[k] = \frac{\sum_{i=k-P}^{k+P} V_m[i]}{\frac{A}{W}+1} \qquad <\text{Equation 1}>$$

In Equation 1, $V_m[i]$ is the i-th voltage value included in the reference voltage curve 300, A is the first time length, W is the sampling time, P=A/2W, and $V_{av1}[K]$ is the long-term average voltage value at the measurement timing tK. The control circuit 140 may determine the first average voltage curve 400 of FIG. 4 by substituting 1 to M to K of Equation 1. The first time length A is preset to an integer multiple of the sampling time W. Accordingly, the first time length A indicates the subset size (A/W+1) used to calculate the long-term average voltage value $V_{av1}[K]$.

Referring to FIG. 5, the second average voltage curve 500 is obtained by applying the second average filter of a second time length B that is shorter than the first time length A to the reference voltage curve 300. The second average filter may be a low pass filter, for example, a centered moving average having the subset size B/W+1 corresponding to the second time length B. In an example, the control circuit 140 determines a short-term average voltage value $V_{av2}[K]$ indexed to the measurement timing tK by calculating an average of the (B/W+1) voltage values included in the sub-voltage curve $S_K$, i.e., the (K-Q)-th voltage value to the (K-1)-th voltage value, the K-th voltage value and the (K+1)-th voltage value to the (K+Q)-th voltage value. Q=B/2W. The short-term average voltage value $V_{av2}[K]$ is an average of the subsets $U_K$ of the sub-voltage curve $S_K$. The subsets UK are a voltage curve of the range of time $t_{K}$~Q $t_{K+Q}$ having the same center $t_K$ as the range of time $t_{K-P}$~$t_{K+P}$ within the range of time of the sub-voltage curve $S_K$. The following Equation 2 represents the second average filter.

$$V_{av2}[k] = \frac{\sum_{i=k-Q}^{k+Q} V_m[i]}{\frac{B}{W}+1} \qquad <\text{Equation 2}>$$

In Equation 2, $V_m[i]$ is the i-th voltage value included in the reference voltage curve 300, B is the second time length, W is the sampling time, Q=B/2W, and $V_{av2}[K]$ is the short-term average voltage value at the measurement timing tK. The control circuit 140 may determine the second average voltage curve 500 of FIG. 5 by substituting 1 to M to K of Equation 2 one by one. The second time length B is preset to an integer multiple of the sampling time W. Accordingly, the second time length B indicates the subset size (B/W+1) used to calculate the short-term average voltage value $V_{av2}[K]$.

The first time length A>the second time length B, each data point (i.e., the long-term average voltage value) of the first average voltage curve 400 may be referred to as a 'long-term average value', and each data point (i.e., the short-term average voltage value) of the second average voltage curve 500 may be referred to as a 'short-term average value'. In an example, A may be 10 times larger than B.

Referring to FIG. 6, the voltage deviation curve 600 is the result of subtracting one of the first average voltage curve 400 and the second average voltage curve 500 from the other. That is, the voltage deviation curve 600 is a time series of a total of M voltage deviations for the predetermined period of time $t_1$~$t_M$. The voltage deviation $\Delta V[K]$ associated with the sub-voltage curve $S_K$ is a value calculated by subtracting one of the long-term average voltage value $V_{av1}[K]$ and the short-term average voltage value $V_{av2}[K]$ from the other. In an example, $\Delta V[K]=V_{av2}[K]-V_{av1}[K]$.

As described above, the long-term average voltage value $V_{av1}[K]$ is an average cell voltage for a long term of the first time length A with respect to the measurement timing tK, and the short-term average voltage value $V_{av2}[K]$ is an average cell voltage for a short term of the second time length B with respect to the measurement timing $t_K$. Accordingly, when the voltage deviation $\Delta V[K]$ is calculated by subtracting one of the long-term average voltage value $V_{av1}[K]$ and the short-term average voltage value $V_{av2}[K]$ from the other, it is possible to effectively remove the measurement noise generated over the predetermined period of time with respect to the measurement timing $t_K$.

Through the process of subtracting one of the long-term average voltage value $V_{av1}[K]$ and the short-term average voltage value $V_{av2}[K]$ from the other, it is possible to mitigate the measurement noise generated over the predetermined period of time with respect to the measurement timing $t_K$ at a considerate level.

The control circuit 140 may compare the voltage deviation $\Delta V[K]$ with a first deviation threshold $TH_1$ and a second deviation threshold $TH_2$. The first deviation threshold $TH_1$ may be a predetermined positive number (for example, +0.001 V), and the second deviation threshold $TH_2$ may be a predetermined negative number (for example, −0.001 V) of which the absolute number is equal to the first deviation threshold $TH_1$.

The control circuit 140 may determine that the battery cell BC is abnormal when a predetermined number (for example, 10) or more of voltage deviations among all the voltage deviations included in the voltage deviation curve 600 are equal to or larger than the first deviation threshold $TH_1$ or are equal to or smaller than the second deviation threshold $TH_2$.

The control circuit 140 may determine that the battery cell BC is abnormal when any two of the total of M voltage deviations included in the voltage deviation curve 600 meet a first requirement, a second requirement and a third requirement. The first requirement is met when one of the two voltage deviations is equal to or larger than the first deviation threshold $TH_1$. The second requirement is met when the other of the two voltage deviations is equal to or smaller than the second deviation threshold $TH_2$. The third requirement is met when a time interval between the two voltage deviations is equal to or smaller than a threshold time. The threshold time may be preset to be smaller than the first time length A. Referring to FIG. 6, the voltage deviation $\Delta V[a]$ is equal to or smaller than the second deviation threshold $TH_2$ (second requirement met), and the voltage deviation $\Delta V[b]$ is equal to or larger than the first deviation threshold $TH_1$ (first requirement met). Accordingly, when the time interval $\Delta t=t_b-t_a$ to between the two voltage deviations $\Delta V[a], \Delta V[b]$ is equal to or smaller than the threshold time, it is determined that the battery cell BC is abnormal.

Figure 7:
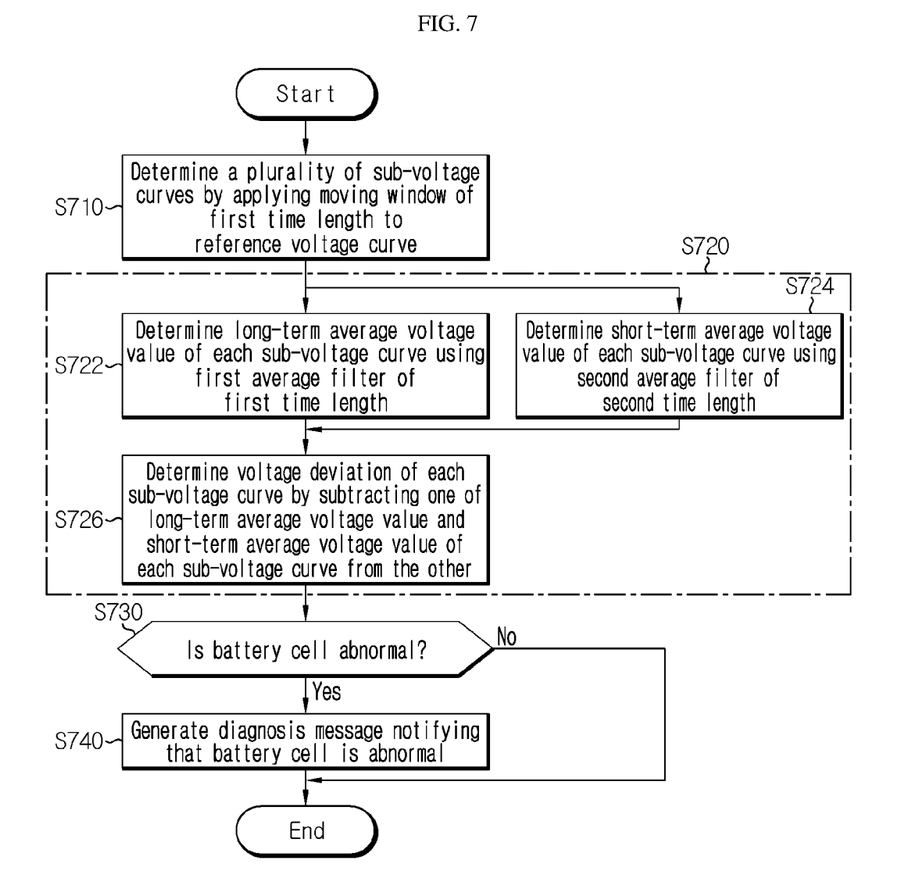
FIG. 7 is a flowchart exemplarily showing a method for diagnosing a battery according to a first embodiment of the present invention.

FIG. 7 is a flowchart exemplarily showing a battery diagnosis method according to a first embodiment of the present disclosure.

Referring to FIGS. 1 to 7, in step S710, the control circuit 140 determines the plurality of sub-voltage curves by applying the moving window of the first time length A to the reference voltage curve 300. The reference voltage curve 300 is a time series of voltage values indicating the cell voltage of the battery cell BC measured at each sampling time for the predetermined period of time $t_1 \sim t_M$.

In step S720, the control circuit 140 determines the voltage deviation $\Delta V[K]$ associated with each sub-voltage curve $S_K$. The step S720 may include sub-steps S722, S724 and S726.

In step S722, the control circuit 140 determines the long-term average voltage value $V_{av1}[K]$ of the sub-voltage curve $S_K$ using the first average filter of the first time length A (see Equation 1).

In step S724, the control circuit 140 determines the short-term average voltage value $V_{av2}[K]$ of the sub-voltage curve $S_K$ using the second average filter of the second time length B (see Equation 2).

In step S726, the control circuit 140 determines the voltage deviation $\Delta V[K]$ by subtracting one of the long-term average voltage value Vavi [K] and the short-term average voltage value $V_{av2}[K]$ from the other.

In step S730, the control circuit 140 determines whether the battery cell BC is abnormal by comparing each of the plurality of voltage deviations determined for the plurality of sub-voltage curves with at least one of the first deviation threshold or the second deviation threshold. When a value of the step S730 is "Yes", step S740 is performed.

In the step S740, the control circuit 140 generates a diagnosis message notifying that the battery cell BC is abnormal. The diagnosis message may be wiredly/wirelessly transmitted through the vehicle controller 2 and/or a user device.

Figure 8:
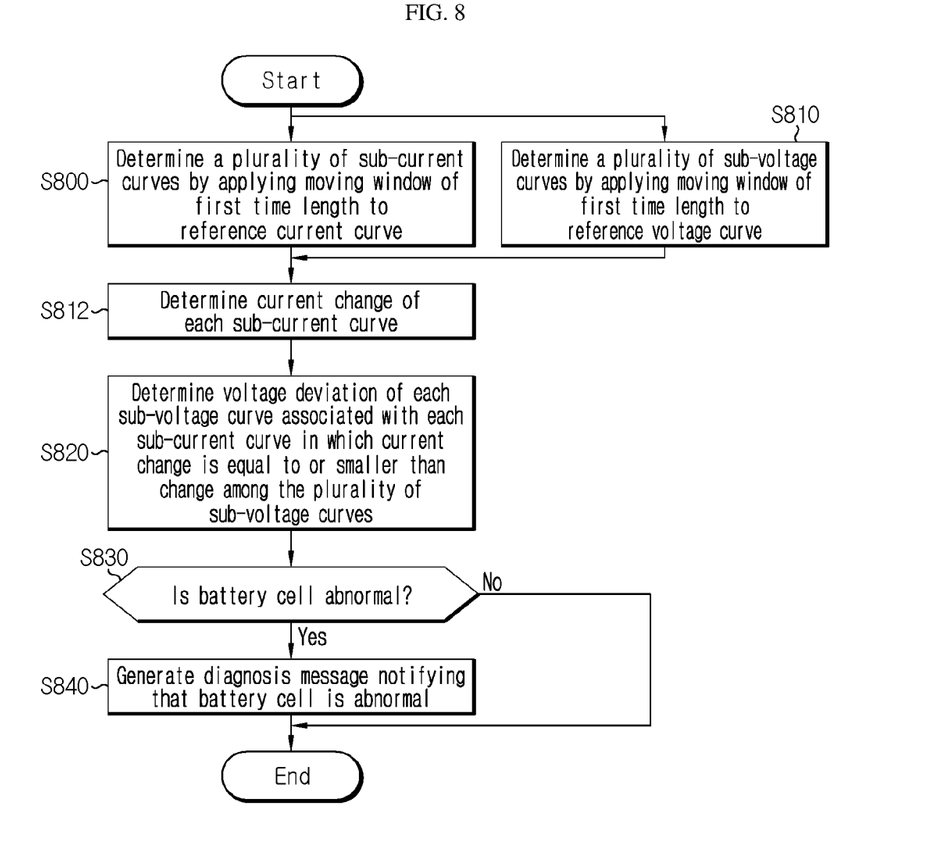
FIG. 8 is a flowchart exemplarily showing a method for diagnosing a battery according to a second embodiment of the present invention.

FIG. 8 is a flowchart exemplarily showing a battery diagnosis method according to a second embodiment of the present disclosure.

Referring to FIGS. 1 to 6 and 8, in step S800, the control circuit 140 determines the plurality of sub-current curves by applying the moving window of the first time length A to the reference current curve 310. The reference current curve 310 is a time series of current values indicating the battery current of the battery cell BC measured at each sampling time for the predetermined period of time $t_1 \sim t_M$.

In step S810, the control circuit 140 determines the plurality of sub-voltage curves by applying the moving window of the first time length A to the reference voltage curve 300. The step S810 is the same as the step S710.

In step S812, the control circuit 140 determines the current change of each sub-current curve $R_K$.

In step S820, the control circuit 140 determines the voltage deviation $\Delta V[K]$ of each sub-voltage curve $S_K$ associated with each sub-current curve $R_K$ in which the current change is equal to or smaller than the threshold change among the plurality of sub-voltage curves. The step S820 may include the steps S722, S724, S726 of FIG. 7.

In step S830, the control circuit 140 determines whether the battery cell BC is abnormal by comparing each voltage deviation determined in the step S820 with at least one of the first deviation threshold or the second deviation threshold. When a value of the step S830 is "Yes", step S840 is performed.

In the step S840, the control circuit 140 generates a diagnosis message notifying that the battery cell BC is abnormal.

The embodiments of the present disclosure described hereinabove are not implemented only through the apparatus and method, and may be implemented through programs that perform the functions corresponding to the configurations of the embodiments of the present disclosure or recording media having the programs recorded thereon, and such implementation may be easily achieved by those skilled in the art from the disclosure of the embodiments described above.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the scope of the appended claims and their equivalents.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and all or some of the embodiments may be selectively combined to allow various modifications.

(Description of Reference Numerals)

| | |
|---|---|
| 1: Electric vehicle | 2: Vehicle controller |
| 10: Battery pack | 11: Battery    BC: Battery cell |
| 100: Battery diagnosis apparatus | |
| 110: Voltage detector | 120: Current detector |
| 140: Control circuit | |

What is claimed is:

1. A battery diagnosis apparatus, comprising:
a voltage detector configured to measure a cell voltage of a battery cell; and
a control circuit configured to:
determine a plurality of sub-voltage curves by applying a moving window of a first time length to a reference voltage curve, the reference voltage curve being a time series of voltage values indicating the cell voltage measured at each sampling time for a predetermined period of time;
for each sub-voltage curve:
determine a long-term average voltage value of the sub-voltage curve using a first average filter of the first time length;
determine a short-term average voltage value of the sub-voltage curve using a second average filter of a second time length that is shorter than the first time length; and
determine a voltage deviation associated with the sub-voltage curve by calculating a difference between the long-term average voltage value and the short-term average voltage value of the sub-voltage curve; and
wherein the control circuit is configured to determine whether the battery cell is abnormal when any two of the plurality of voltage deviations determined for the plurality of sub-voltage curves meet a first requirement, a second requirement and a third requirement,
wherein the first requirement is that one of the two voltage deviations is equal to or larger than a first deviation threshold,
wherein the second requirement is that the other of the two voltage deviations is equal to or smaller than a second deviation threshold, and
wherein the third requirement is that a time interval between the two voltage deviations is equal to or smaller than a threshold time.

2. The battery diagnosis apparatus according to claim 1, wherein the first deviation threshold is a positive number, and
wherein the second deviation threshold is a negative number of which an absolute value is equal to the first deviation threshold.

3. The battery diagnosis apparatus according to claim 1, wherein the battery cell is abnormal when the voltage deviations of a predetermined number or more of sub-voltage curves among the plurality of sub-voltage curves are larger than the first deviation threshold or smaller than the second deviation threshold.

4. The battery diagnosis apparatus according to claim 1, further comprising:
a current detector configured to measure a battery current flowing through the battery cell.

5. The battery diagnosis apparatus according to claim 4, wherein the control circuit is configured to determine a plurality of sub-current curves by applying the moving window to a reference current curve, the reference current curve being a time series of current values indicating the battery current measured at each sampling time for the predetermined period of time, and
wherein the plurality of sub-current curves have a one-to-one correspondence with the plurality of sub-voltage curves.

6. The battery diagnosis apparatus according to claim 5, wherein the control circuit is configured to, for each sub-current curve,
determine a current change which is a difference between a maximum current value and a minimum current value of the sub-current curve, and
determine the long-term average voltage value and the short-term average voltage value of the sub-voltage curve associated with the sub-current curve when the current change is smaller than a threshold change.

7. A battery pack comprising the battery diagnosis apparatus according to claim 1.

8. An electric vehicle comprising the battery pack according to claim 7.

9. A battery diagnosis method, comprising:
measuring, by a voltage detector, a cell voltage of a battery cell at each sampling time for a predetermined period of time;
determining, by a control circuit, a plurality of sub-voltage curves by applying a moving window of a first time length to a reference voltage curve, the reference voltage curve being a time series of voltage values indicating the cell voltage;
determining, by the control circuit for each sub-voltage curve, a long-term average voltage value of the sub-voltage curve using a first average filter of the first time length;
determining, by the control circuit for each sub-voltage curve, a short-term average voltage value of the sub-voltage curve using a second average filter of a second time length that is shorter than the first time length; and
determining, by the control circuit for each sub-voltage curve, a voltage deviation associated with the sub-voltage curve by calculating a difference between the long-term average voltage value and the short-term average voltage value of the sub-voltage curve; and
determining, by the control circuit, whether the battery cell is abnormal when any two of the plurality of voltage deviations determined for the plurality of sub-voltage curves meet a first requirement, a second requirement and a third requirement,
wherein the first requirement is that one of the two voltage deviations is equal to or larger than a first deviation threshold,
wherein the second requirement is that the other of the two voltage deviations is equal to or smaller than a second deviation threshold, and wherein the third requirement is that a time interval between the two voltage deviations is equal to or smaller than a threshold time.

10. The battery diagnosis method according to claim 9, wherein the battery cell is abnormal when the voltage deviation of a predetermined number or more of sub-voltage curves among the plurality of sub-voltage curves is larger than the first deviation threshold or smaller than the second deviation threshold.

11. The battery diagnosis method according to claim 9, further comprising;

determining a plurality of sub-current curves by applying the moving window to a reference current curve, the reference current curve being a time series of current values indicating a battery current measured at each sampling time for the predetermined period of time, and wherein the plurality of sub-current curves have a one-to-one correspondence with the plurality of sub-voltage curves.

12. The battery diagnosis method according to claim 11, wherein, for each sub-current curve, determining a current change which is a difference between a maximum current value and a minimum current value of the sub-current curve, and determining the long-term average voltage value and the short-term average voltage value of the sub-voltage curve associated with the sub-current curve on a condition that the current change is smaller than a threshold change.

13. The battery diagnosis method according to claim 9, wherein the first deviation threshold is a positive number, and wherein the second deviation threshold is a negative number of which an absolute value is equal to the first deviation threshold.

\* \* \* \* \*